310-369 SR

XR 3,899,698

United States Patent [19]

Kleinschmidt

[11] 3,899,698

[45] Aug. 12, 1975

[54] PIEZOELECTRIC KEY

[75] Inventor: Peter Kleinschmidt, Munich, Germany

[73] Assignee: Siemens Aktiengesellschaft, Berlin & Munich, Germany

[22] Filed: Mar. 18, 1974

[21] Appl. No.: 452,060

[30] Foreign Application Priority Data

Mar. 22, 1973 Germany ........................... 2314420

[52] U.S. Cl. ................. 310/9.5; 200/181; 235/145; 310/8.1; 310/8.2; 310/8.7; 310/9.4; 310/9.6; 310/9.8; 331/65; 331/163; 340/365 A

[51] Int. Cl.$^2$ .......................................... H01L 41/10

[58] Field of Search ............... 310/8.3, 8.7, 9.5, 9.6, 310/9.4, 9.1, 8.1; 200/181, DIG. 4; 179/90 K; 235/145; 340/365 A; 317/144; 331/65, 116, 163

[56] References Cited

UNITED STATES PATENTS

| | | | |
|---|---|---|---|
| 3,045,491 | 7/1962 | Hart | 310/8.7 UX |
| 3,274,828 | 9/1966 | Pulvari | 310/8.7 UX |
| 3,541,849 | 11/1970 | Corbett | 310/8.7 X |

*Primary Examiner*—Mark O. Budd
*Attorney, Agent, or Firm*—Hill, Gross, Simpson, Van Santen, Steadman, Chiara & Simpson

[57] ABSTRACT

A piezoelectric key for actuation by an attentionally directed and dimensioned compressive force includes a piezoelectric transducer for controlling an electrical amplifier element of an electronic circuit. The body of the transducer includes a directionally and permanently polarized piezoelectric material having electrodes situated thereon for taking off an electrical voltage. The body, in each plane perpendicular to the direction of the compressive force, has an approximately constant cross section and a thickness dimension $d$ which is small with respect to another dimension of the body, the body being polarized in the direction of its thickness $d$. The electrodes are applied to the surfaces of the body which pulls each other in the direction $d$ and the body is arranged in the key in such a way that the dimension $d$ is essentially aligned perpendicular to the direction of application of the compressive force. The body is polarized throughout its volume and a dimension $l$ (corresponding to length or circumference) which is essentially perpendicular to the thickness and to the direction of application of the compressive force is dimensioned several times greater than the dimension $d$, and the body has a dimension $h$ which is perpendicular with respect to the dimensions $d$ and $l$ and which is larger than approximately ten times the dimension $d$.

41 Claims, 19 Drawing Figures

PATENTED AUG 12 1975 3,899,698

SHEET 1

PIEZOELECTRIC KEY

BACKGROUND OF THE INVENTION

1. Field of the Invention

This invention relates to a piezoelectric key or push button which is actuated by a compressive force of a determined magnitude and direction, and more particularly to such a key which comprises a piezoelectric transducer for controlling an electric amplifier element of an electronic circuit wherein the body of the transducer includes a permanently polarized, piezoelectric material provided with electrodes for taking off the electrical voltage and current, the body having an almost constant cross section in every plane perpendicular to the direction with which the compressive force in the key acts upon the body and having a thickness dimension *d* which is small with respect to another dimension of the body, the body being polarized in the direction of the dimension *d* and the electrodes being located on surfaces of the body which are oppositely disposed with respect to each other at a distance determined by the dimension *d*.

2 Description of the Prior Art

A large number of keys for connecting or disconnecting electrical circuits is known in the art. Also, keys or push buttons have been made known which comprise piezoelectric ceramic bodies for the production of an electrical voltage. Keys of this kind have the advantage, for respective cases of application, that they not only close a circuit, but they themselves are able to produce the voltage for producing the current in the circuit from the mechanical compressive force acting upon such keys.

Piezoelectric keys have been realized, in particular, by means of application of bending strips, at least a part of such bending strips consisting of a piezoceramic material. In order to actuate such a key, the force acting upon a bending strip must create a distinctly noticeable bending motion of the strip.

A further embodiment of a piezoelectric key has become known from the German Offenlegungsschrift No. 2,064,654 in which a disc-shaped member of piezoceramic material is employed. The compressive force provided for the actuation of the key acts upon the surface of the disc in such a way that the disc is pushed in the direction of its thickness. Here the compressive force for actuation is provided over a distance which lies below the limit of perceptibility available to man.

It has been observed that piezoelectric keys are sensitive to temperature changes which might occur during a more or less short duration, that is over substantially short intervals of time. It has been noticed that these keys can respond to changes of the ambient temperature in the same manner as they respond to intentionally applied compressive forces. This effect occurs in the case of a piezoelectric bending strip due to its construction only to a subordinate extent; however, particularly the construction of a key with bending strips requires relatively great expenditures and efforts and in addition, a considerable actuating path.

The omission of distance of an actuating path for a switching key is of particular interest where a dust proof and/or moisture proof assembly is important, or where protection with respect to the possibility of a deliberate damage by means of avoiding slit-like openings along relatively movable parts is to be avoided.

SUMMARY OF THE INVENTION

It is an object of the invention to provide a piezoelectric key which is to be operated with a compressive force which is essentially actuation path free and which, within practical and sensible limits relative to its manner of operation, is insensitive to externally acting temperature changes.

The foregoing object is achieved with a key, such as initially described, which is characterized according to the invention in that the piezoelectric body is arranged within the key in such a way that its thickness dimension *d* is essentially directed perpendicularly to the direction in which the intentional compressive force in the key acts upon the body, that the body is polarized along the dimension *d* within a volume (determined by the dimensions $d \cdot h \cdot l$), that a dimension *l* (length or circumference) is essentially perpendicular with respect to the thickness *d* and is perpendicular with respect to the direction in which the compressive force in the key acts upon the body and is dimensioned several times larger than the dimension *d*, and that the body has a dimension *h* which is perpendicular with respect to the dimensions *d* and *l* and which is larger than approximately 10 times the dimension *d*.

The most suitable values for the dimension *l* are between 3 and 30 mm for actuating the key with a finger according to the invention. In particular, in the case of a key constructed according to the invention which is actuated mechanically, it is advisable to measure the dimension *l* according to the equation.

$$1 = n \cdot |g_{31}| \cdot K/U$$

wherein K in the equation is the value of the intentionally applied compressive force acting upon the surface $l \cdot d$ of the body in the key, $g_{31}$ is the piezoelectric voltage constant of the material of the body, and U is the value of the responding electrical voltage of the subsequent electronic circuit.

A safe pyrointerval, i.e. the ratio between the value of the piezovoltage or the piezopower, respectively, occurring during actuation and the possible value of a pyrovoltage or a pyropower, respectively, is obtained if the dimension *d* is chosen to be smaller than 0.5 mm. A lesser margin for the dimension *d* results from the technological possibilities for the production of thin piezoelectric ceramic bodies.

The elctrodes for taking off the piezoelectric voltage, at which also the pyrovoltage according to the invention occurs which is reduced in a proportional minimum, are applied to the surfaces $h \cdot 1$ of the body.

Additional details of the piezoelectric voltage constant $g_{31}$ can be taken from the state of the art, e.g., Valvo-Manual: "Piezooxides", 1971, in particular on Page 20. The direction 1 coincides with the height *h*, as stated above, and the direction 3 coincides with the thickness *d*, also as stated above.

BRIEF DESCRIPTION OF THE DRAWINGS

Other objects, features and advantages of the invention, its organization, construction and operation will be best understood from the following detailed description of preferred embodiments of the invention, taken in conjunction with the accompanying drawings, on which.

DESCRIPTION OF THE PREFERRED EMBODIMENTS

Figure 1:
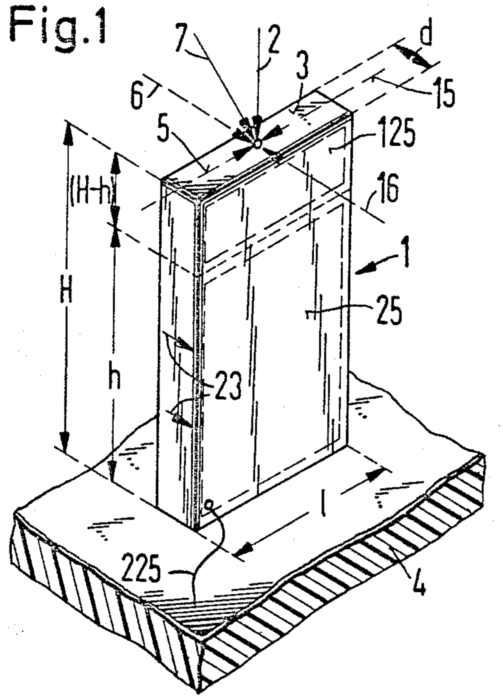
FIG. 1 is a perspective view of a piezoelectric transducer mounted on a supporting surface showing relevant directions, dimensions and applications of forces to aid in better understanding the present invention.

FIG. 1 will serve as an explanation of the details of the teaching according to the present invention. In FIG. 1 a piezoelectric body 1, a ceramic body, is provided as an electromechanical transducer of a piezoelectric key and comprises, at least in a sub-volume $l \cdot h \cdot d$, which will be described in greater detail below, a material which is permanently polarized. Some of the known materials which may be used to advantage for the body 1 are, for example, barium-titanate and leadtitante-zirconate, if necessary with additives which improve the piezoelectric characteristics of the material.

As can be seen from FIG. 1, the body 1 has a form with the dimension $d$, $l$ and the dimension $h$ for this sub-volume. The compressive force acting upon the body 1 in a predetermined manner or in the vectorial direction of an intentionally applied force is identified by the arrow 2. As long as there is no directional deflection and/or translation of the compressive force affecting the key from the outside, the force 2 in the key corresponds, according to direction and magnitude, to the force which will be hereinafter referred to as an "intentional" force or an "intentionally applied" force which acts upon the body.

According to a feature of the invention illustrated in FIG. 1, the compressive force in the key acts upon the surface 3 of the body in a direction perpendicular to the dimension $d$ and parallel to the dimension $h$ or H, respectively. The surface 3 of the body 1 which faces upwardly in FIG. 1 has the lateral dimensions $d$ and $h$. In order to simplify matters, it is assumed that the compressive force 2 acts upon the center of the surface 3. The compressive force, which necessarily opposes the body with respect to the compressive force 2, is applied by a base plate 4, which supports the body 1 and, as illustrated in a sectional view, supports the body 1 on the lateral surface which opposes the surface 3.

The body 1 is polarized in the direction $d$ within the sub-volume $l \cdot h \cdot d$, as is indicated by the arrows 23. The electrodes 24 and 25 (only electrode 25 being visible in FIG. 1, see FIG. 2) are located on the surfaces $l \cdot h$ of the body which are perpendicular with respect to the direction of polarization, which electrodes 24 and 25 also serve for the application of a high electrical voltage for polarizing the body, as well as serving for output electrodes for taking off the piezoelectrically produced voltages for the subsequent electronic circuit.

As already mentioned above, the sub-volume which is identified by the height $h$ is the part of the body 1 which acts piezoelectrically and, therewith, also pyroelectrically. It is advantageous to make the height $h$ somewhat smaller than the total height H of the body 1. A further advantage, which will be described later on, resides in the provision of heat insulation. A still further advantage resides in the details of circuit organization of the electronic circuit utilized with the piezoelectric key.

The length $l$ of the sub-volume is normally equal to the corresponding outer dimension L of the body itself. In order to avoid electrical short circuits between the electrodes 24 and 24 which are oppositely disposed with respect to each other, it can be provided that the length $l$ is somewhat smaller than the corresponding outer dimension, which is also readily apparent from the structure illustrated in FIG. 1. As far as the dimension $l$ of the polarized sub-volume is smaller than the outer dimension L of the body, K will be that part of the force which is applicable to the dimension $l$. However, this correction is not normally necessary.

A particular embodiment or further development, respectively, of a key constructed according to the invention is carried out in such a way that the piezoelectric body of the key performs no, or practically only an insufficient, bending motion under the influence of an intentionally applied compressive force. In a lateral view of the body 1 looking toward the surface $H \cdot d$ in FIG. 2, a bending motion according to such an embodiment or development, respectively, is clearly indicated. The force 2 applied to the surface 3 can lead to a deflection or bending of the body 1, as is indicated by the broken lines 21. Such a deflection of the body 1 results in piezoelectrically produced voltages in the piezoelectric zone of the body 1, which voltages result in an overall voltage between the electrodes 24 and 25 whose magnitude and polarity is dependent upon the type and direction of the deflection and which practically cannot be determined in advance. However, this voltage would be superimposed with respect to the piezoelectric voltage intentionally produced by means of the longitudinal change of the length of the body 1 due to the compressive force, and it would disturb or interfere with this piezoelectric voltage in a manner which, for all practical purposes, cannot be determined in advance, provided a deflection, such as mentioned above, occurs.

Therefore, it is the aim of the specific embodiment or development, respectively, of the invention to eliminate the occurrence of a deflection of the piezoelectric body within the key, according to the invention, at least so far that no disturbance occurs.

A bending motion can occur, aside from the greater force 2, by means of forces which deviate from the direction of the force 2. The references 5, 15 and 6, 16, respectively, designate compressive forces which are illustrated with broken lines and which, in practice, may possibly act upon the body 1. These compressive forces are assumed to be forces acting perpendicularly to the compressive force 2 upon the upper part of the body 1 in FIG. 1. The forces 5, 15 and 6, 16, respectively, can be force components of a compressive force acting upon the key, as assumed in practice, which is illustrated in FIG. 1 and identified with the reference characters 7. The component of the third direction in the compressive force 2 acting upon the body 1 as an intentionally applied force.

The compressive force 7 can be, for example, the compressive force exerted by a finger and actually externally acting upon the key.

It is guaranteed by the measures utilized for bending resistance, which will be explained in greater detail below, that in the body 1, practically only a compressive force understood to be an intentional force acts in the direction 2, in parallel to the dimension $h$, in a longitudinal change $\Delta h$, and that an overly great compressive force and/or force components in a direction perpendicular thereto, such as indicated by the references 5, 15 and 6, 16, respectively, are largely ineffective. The insensitivity of the key with respect to undesired force influences can still be increased according to further developments, particularly by means of the mounting of the body into the housing, as will be explained in greater detail below.

Figure 3:
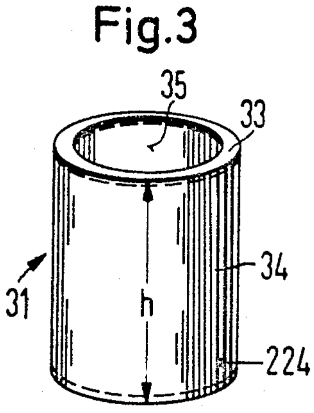
FIG. 3 illustrates the provision of a tubular body as a piezoelectric transducer.

An embodiment of the invention in which the body is provided with a profile having a bending resistance, is illustrated in FIG. 3. The body illustrated in FIG. 3 is in the form of a tube. The form of a tube is advantageous, whereby the cross section of the tube may be circular, oval or rectangular. It is important herein that the bending resistance is present for a compressive force of such a direction in which a compressive force can be applied to the body in the key. At least in the normal case, it will be sufficient that the bending resistance exists for a compressive force acting in the direction of the axis of the tube, i.e. in the direction of the height H, upon the front surface 33.

In the case of application of a tube (instead of the body 1) as is designated 31 in FIG. 3, the average size of the circumference of the tube 31 is utilized as the dimension $l$ according to the invention. The wall thickness of the tube is to be taken for the thickness $d$ of the body.

Figure 5:
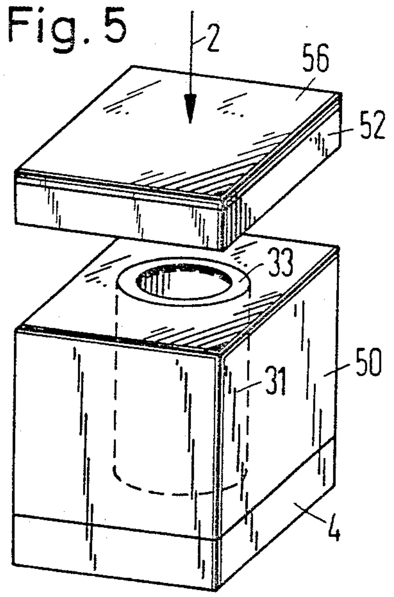
FIG. 5 illustrates potting of a piezoelectric transducer, such as illustrated in FIG. 3, for protection against moisture and for heat insulation.

The tube in FIG. 3 has a pair of electrodes 34 and 35 applied to the outer and inner surfaces thereof, respectively, to serve for taking off of the piezoelectrically produced voltage. These electrodes extend over a distance corresponding to the height $h$ and are illustrated with the borders thereof in broken lines. Referring for a moment to FIG. 5, the tube 31 is illustrated as being embedded in a casting resin for protection against moisture and for heat insulation.

Figure 4:
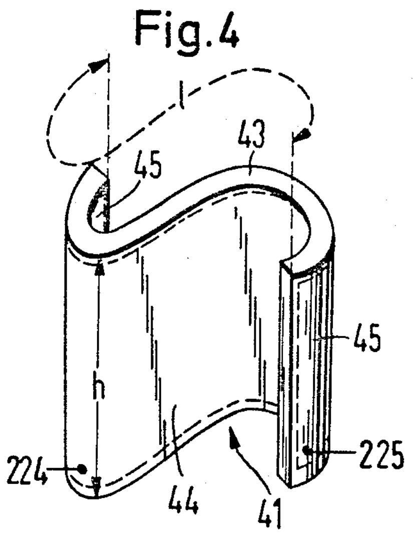
FIG. 4 illustrates the provision of an S-shaped body as a piezoelectric transducer.

Comparable with a tube, a corrugated, curved or wavy profile, such as the S-shaped structure illustrated in FIG. 4 may be utilized as the piezoelectric body, referenced 41 in FIG. 4. The length $l$ of the profile corresponds to the dimension $l$, as is marked on the drawing. The body 41 is piezoelectrically characterized across its entire length $l$ and is provided with electrodes 44 and 45 which are illustrated within the broken lines.

Figure 2:
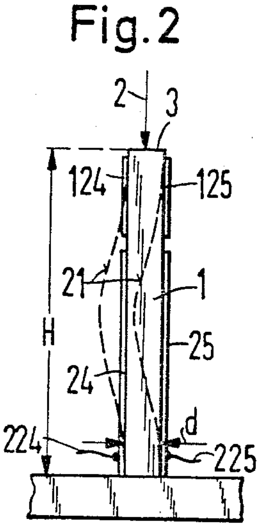
FIG. 2 is an elevational view of the apparatus of FIG. 2 showing more detail of the structure of the piezoelectric transducer.

The force 2 acts upon the surface 43, which correponds to the surface 3 of the body 1 in FIGS. 1 and 2.

The utilization of a supporting member serves, according to the already specified further development, for avoiding a bending motion of a piezoelectric body, which supporting member provides the piezoelectrically effective body with the required bending resistance by means of its shape and by means of its association with the piezoelectrically body, if need be, in cooperation with the latter. The material and the dimensions of the supporting member are selected in such a way that the supporting member of the predetermined compressive force which is effective in the key, has, in comparison to the body of the transducer, a greater or not considerably smaller integral pressure-elastic resilience.

An embodiment of this development with a supporting member provides that the body of the transducer, e.g., the body 1 or 31, is embedded in an elastic casting resin, whereby only the surface 3 or 33, respectively, and the surface which is oppositely disposed with respect to such surface, stands on the supporting base 4 are essentially free from the casting resin. FIG. 5 illustrates such an embedding for a small tube 31 as illustrated in FIG. 3, in an exploded view. The casting resin is designated with the reference character 50 and a cover plate is identified with the reference character 52. The cover plate 52 receives the intentional compressive force and transmits the same to the small tube 31.

Figure 6:
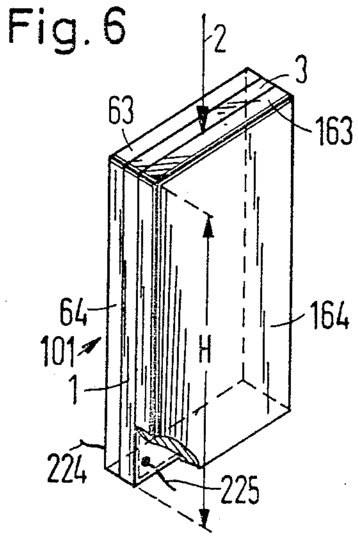
FIG. 6 is a perspective view of a particularly preferred embodiment for a piezoelectric key according to the invention.

FIG. 6 schematically illustrates a particularly preferred embodiment for a key, according to the invention, wherein a pair of small plates 64 and 164 are applied to the body 1 of the transducer as supporting members on the two large surface sides $l \cdot$ H. The small plates are preferably bonded to the body 1. A thin coating consisting of thermosetting plastic, e.g., Technicoll 401 or 411, respectively, with subsequent heat treatment, has proven to be suitable as an adhesive material. The body 1 and the small plates 64 and 164 therefore form a body unit 101 which is resistant to bending due to its layer construction. In the direction of the compressive force 2 which acts upon the surface 3 of the body 1 and upon the surfaces 63 and 163 of the small plates 64 and 164, the plates 64 and 164 are much more resilient than the ceramic of the body 1. Accordingly, the compressive force 2 is primarily effective in the body 1. A polyacrylic glass has proven to be suitable as a material for the small plates 64 and 164. The thickness of the plates is selected such that the necessary bending resistance is obtained. It should be taken into account that, when bonding the plates to the body 1, the bending resistance—apart from the differences of the modulus of elasticity—increases with the third power of the sum of the individual thicknesses, and the resistance with respect to the compressive force 2 increases only linearly with the total thickness.

The electrodes 24, 25 and 124, 125 in FIGS. 1 and 2 are situated on the body 1 and sandwiched between the respective surfaces of the body 1 and the small plates 64 and 164.

Figure 7:
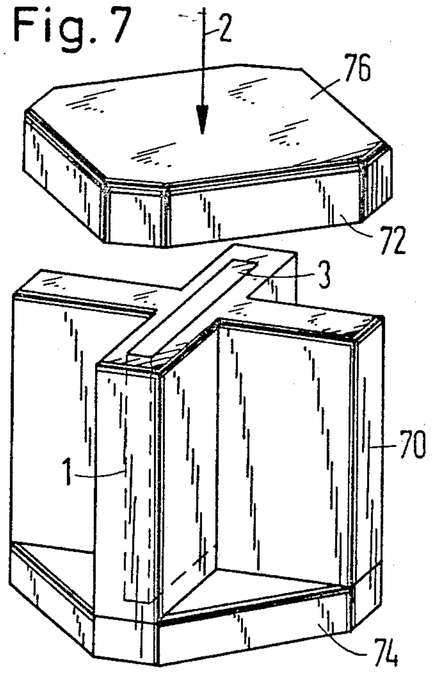
FIG. 7 is an exploded view of an embodiment of the invention in which the transducer is located within a supporting member having an X-shaped profile.

FIG. 7 illustrates, in an exploded view, an embodiment of the invention in which the body 1 of the transducer is located within a supporting member 70 having an X-shaped profile. A closing part 74, corresponding to the base plate 4, yields little with respect to the material of the body 1. A cover plate 72, which corresponds to the cover 52 in FIG. 5, covers the upper surface and carries a plate 76, consisting of a material having a small thermal coefficient of expansion, e.g. Invar.

Figure 8:
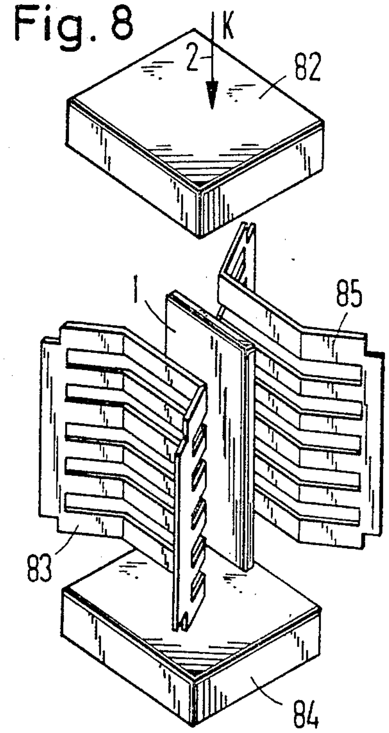
FIG. 8 is an exploded view of another embodiment of the invention in which supporting members have a high elastic resilience in the direction of the intentionally applied compressive force.

FIG. 8 illustrates a further embodiment of the invention, which is shown exploded in both the longitudinal and transverse directions, and which comprises a transducer body 1 and a pair of supporting members 83 and 85 constructed out of metal having a low thermal expansion coefficient, e.g., Invar.

The supporting members 83 and 85 are bent as illustrated in the drawing and includes slot-like openings to provide the supporting member with a high elastic resilience in the direction of the compressive force 2. The transducer body 1 and the supporting members 83 and 85 are arranged against each other and between and against the adjacent pressure resistance plates 84 and 82.

Figures 9, 10, 11, 12, 13:
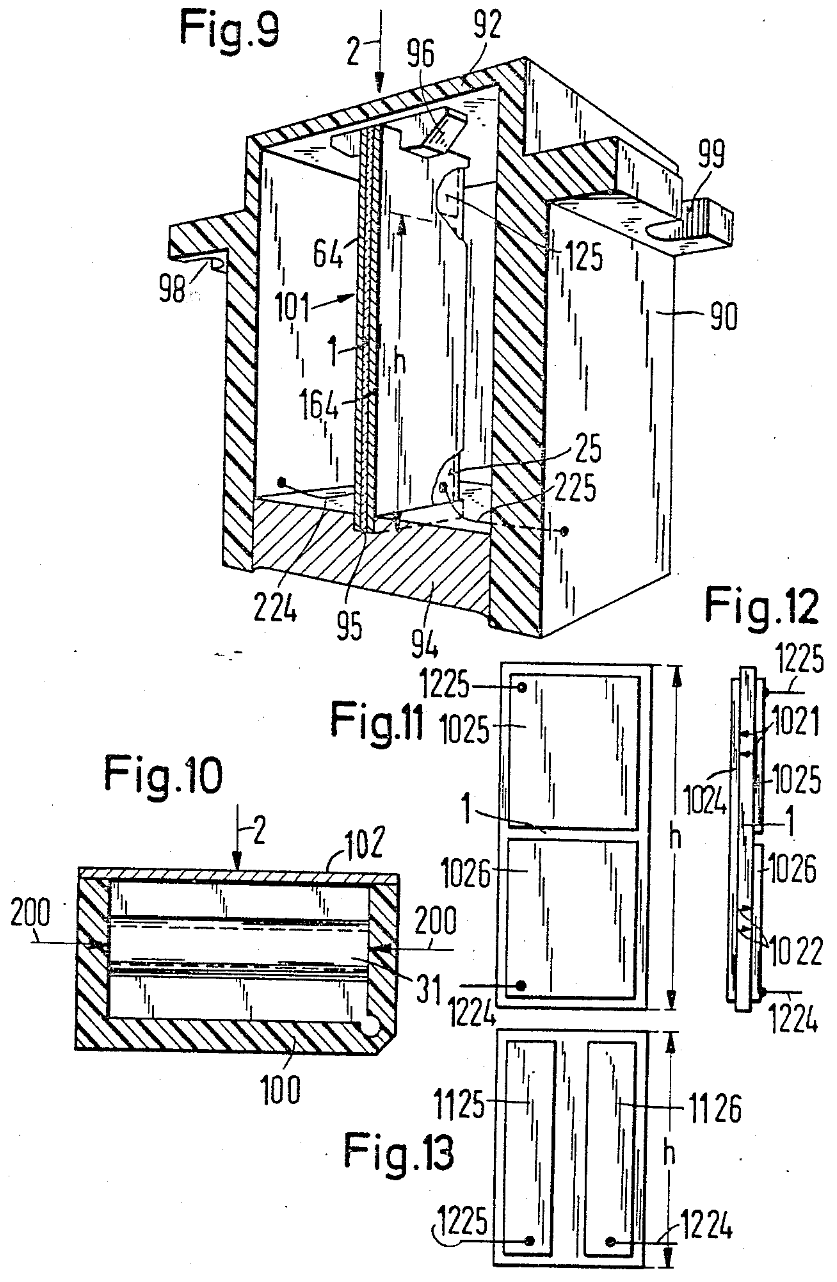
FIG. 9 is a perspective sectional view of a particularly preferred embodiment of the invention for the construction of a piezoelectric key in a mechanically rigid housing.
FIG. 10 illustrates the mounting of a tubular piezoelectric transducer within a heat insulating housing.
FIGS. 11–15 illustrate advantageous embodiments of piezoelectric devices with different electrode configurations.

FIG. 9 illustrates a particularly preferred embodiment for the construction of a key according to the invention in a cross section perspective view. In FIG. 9 the key includes a mechanically rigid housing 91. The body 1, with the supporting members 64 and 164, i.e., the unit 101 of FIG. 6, is situated between the cover plate 92 which receives the intentionally applied force and the base plate 94 which is necessary for providing the counter pressure, the base plate 94 corresponding to the plate 4 in FIG. 1. The transducer body with the supporting members is held in a groove 95 formed in the base plate 94. On the inner side of the plate 92, the transducer body with the supporting members is secured with respect to lateral displacement in a holding block 96 which is provided with a slot comparable to the slot 95 in the base plate 94. In comparison to the dimension $l$, the holding block 96 is short, which is readily apparent from the drawing, whereby such forces can be rendered inoperative with respect to the body unit 101, which forces would otherwise be able to act transversely upon the body unit due to thermal expansion of the plate 92.

Due to a somewhat flexible mounting in the slots, the transducer body with its supporting members is insensitive to obliquely acting compressive forces, such as the force 7 in FIG. 1, since transverse components of the force 7 cannot cause a bending of the transducer body, even when the housing 90 is somewhat resilient.

In the exemplary embodiment illustrated in FIG. 9, the particulary preferred further development, which is also illustrated in FIG. 1, is realized at the transducer body, according to which development the upper part of the transducer body 1 in the housing (above the height $h$) is piezoelectrically inactive. This part is also pyroelectrically inactive. Accordingly, the key of FIG. 9 is practically insensitive to a heat flow from the upper plate 92 into the body 1 of the transducer. The plate 92, which receives the application of pressure, e.g., with the finger, therefore does not have to be particularly heat insulated for cases of application where only moderate temperature changes of the plate 92 are encountered in order to prevent pyrovoltages at the body 1. The compressive force, which is transmitted by the relatively narrow holding block 96, is distributed in the inactive upper sub-volume onto the entire length $l$ of the active part $h$.

In the case of the embodiment according to FIG. 9, the plate 92, upon which the pressure acts, has little bending resistance and transmits the essential part of the intentional compressive force to the body unit 101 or the body 1. The lateral parts of the housing 90 are relatively slightly resilient in the longitudinal direction. These lateral parts are provided with projecting bosses 98 and 99 which serve for mounting of the key.

Connection leads 224 and 225, illustrated in FIGS. 1 and 9, are provided for the electrodes 24 and 25 on the body 1 and lie beneath the supported plates 64 and 164.

The body 1 of the exemplary embodiments of FIGS. 6 and 9 consisting of a single piece and having a piezoelectrically effective part $h$ and a non-piezoelectric part $H - h$ can also consist of two pieces $h$ and $H - h$ which are disposed one on top of the other, as if they were a single piece as illustrated in FIG. 1. The two pieces are advantageously held together in this position by the small plates 64 and 164.

FIG. 10 illustrates an embodiment of the invention in which the compressive force 200, which acts intentionally upon the body of the transducer in the key, has a direction which deviates from the intentional compressive force 2 which acts upon the key itself from the outside.

A small tube 31, such as illustrated in FIG. 3, is provided as the piezoelectric body. Preferably, the housing is heat insulating and, as illustrated in a sectional view, is designated with the reference character 100. A plate, which is identified with the reference character 102, is provided to be deflected by the intentionally applied compressive force 2. As a result of the deflection of the plate 102, the force and counter force 200 act upon the ends of the small tube 31.

The invention is based on consideration which will be described as follows. With the help of the piezoelectric effect, it is possible, when utilizing a permanently aligned polarized, i.e. piezoelectric, ceramic to produce an electrical voltage by means of the application of a compressive load, which voltage is suited for the control of an electronic circuit. An electromagnetic relay switch can be actuated when proceeding from this circuit. However, as it was found in earlier development tests, a great pyro-effect occurs in the case of a piezoelectric ceramic, due to the great temperature dependency of the polarization, which pyro-effect, as mentioned above, can lead to electrical voltages which may easily be of the same magnitude as piezoelectrically produced voltages, or which may even be greater by some orders of magnitude. Therefore, a conductive discharge always has to be provided in the case of the piezoelectric key, whereby the discharge may occur via the conductivity of the ceramic itself and/or via a parallel resistance. It is possible, though, by means of particularly costly heat insulation to influence the pyro-effect, at least to such an extent that the load displacements, on which the pyrovoltage is based, takes place at such a slow pace that they are small per unit of time in comparison to the load displacements which are produced piezoelectrically due to the influence of pressure, which means that the pyrocurrent, i.e., the low displacement per unit of time which is subject to heat, is small with respect to the piezocurrent.

In the case of the key according to the invention, uses made of this technical measure for the reduction of consequences of the pyroeffect, which will be explained in detail in the following exemplary embodiments. It is an important fact of the invention that the independence of temperature of the key is based on constructive measures, namely the dimension and the arrangement of the body of the transducer in the key which is dimensioned in such a way that the voltages or currents, respectively, which are piezoelectrically produced by the intentional compressive force are considerably above the values of pyrovoltages or pyrocurrents, respectively, which may occur in practice as a result of temperature changes of the transducer body appearing over an interval of time whereby the time intereval is the maximum duration occurring in practice for the considerable increase of the compressive force.

By means of the teaching of the present invention, a considerable safety factor is achieved in the key for the piezoelectric useful voltage produced by the intentional compressive force with respect to the pyroelectric voltage, as well as for the corresponding currents. The thresholds of the subsequent electronic circuit whichp processes the piezoelectric voltage signal and the current signal can therefore have a considerable difference from the maximum possible pyrovoltage, and the key, according to the invention, together with the circuit will still indicate a signal, even if a possibly somewhat slighter pressure is applied.

According to the invention, an important feature of the transducer body is that the compressive force acting upon the body stresses the body edgewise, that is longitudinally. This means that the thickness dimension $d$ of the body which is transverse to the direction of pressure is small, at least three times smaller, preferably at least ten times smaller, than the directionally measured height $h$ of the body. The thickness $d$ is normally 0.5 mm. The pyrovoltage increases as the thickness increases, but the pyrovoltage does not change with constant compressive force. It is advantageous to make the body considerably thinner than 0.5 mm, since a greater difference between the piezovoltage and pyrovoltage is achieved with such thinner bodies. Primarily, technological difficulties oppose a decrease in thickness.

The dimension $l$, together with the height $h$ is important for the surface magnitude of the electrode and therewith for the magnitude of the piezocurrent supplied by the key when pressure is applied. A minimum current is to be produced during pressure application so that the input transistor of the subsequent electronic circuit can be controlled accordingly. It is advisable to dimension the value $l$ with $n$ between 0.3 and 2.0, according to the formula $$1 = n \cdot |g_{31}| \cdot K/U$$

for pressure values which are exerted with the finger and which amount to approximately 1 Newton, values between 3 and 20 mm can be obtained in the case of threshold voltages of about 1 volt. In the case of such values for $l$ and together with values for $h$, which will be discussed later on, the key, according to the invention, supplies—in the case of finger pressure with a pressure changing speed of about 10 Newton/seconds—piezocurrent intensities which are entirely sufficient to control a bipolar transistor. In other words, a key is obtained with a low impedance which is suited for the direct control of bipolar transistors. Surprisingly, 3 to 20 mm for the value $l$ result in a dimension which is practically not greater than the width of the finger so that the force supplied by the finger can actually be exerted onto the entire surface (surfaces 3 in FIGS. 1 and 6 and 33 in FIG. 3). From this it follows that for the pyrodistance the cross section $l \cdot d$ is to be made small within the frame work of technically realizable dimensions, whereby in the case of the above stated values for $l$, a value proves to be suitable for the thickness $d$ which is small in comparison to the value of $l$.

A value of a few millimeters, particulary between 5 and 25 mm, results from the above stated proposals for dimensions with respect to the height.

For the control of a bipolar transistor with a given threshold voltage of 0.6 volt and a finger pressure of 1 to 2 Newton, the following dimensions are preferred for a body in an embodiment according to FIG. 6:

$d$ = 0.5 to 0.1, or rather 0.15 mm.

$l$ = 5.0 to 10 mm.

$h$ = 5.0 to 20 mm.

For the small plates 64 and 164 which are provided as supporting members, a copolymer of vinylester-vinylchloride (Astralon), a polyacrylnitrile (Plexiglass) or polystyrol having a thickness of 0.3 to 0.6 mm has been selected for each of the plates. As opposed to these materials, the ceramic has a modulus of elasticity which is approximately 20 times greater.

A value of $10^{-2}$ V-m/Newton can be taken as a basis for the magnitude of the piezoelectric constant $g_{31}$.

Whe actuating a key thus dimensioned according the invention, a piezoelectrically produced power of about $10^{-7}$ W with a source capacitance of 15 nF was achieved in the case of an increase force of 1 Newton, as is typical for finger pressure, during an actuating period of 0.1 second. The deformation of the body of the transducer is approximately 0.3 $\mu$m in the case of a dimension as stated with the force of 1 Newton. A key constructed according to the invention has the advantage of being able to operate without an idle current which is necessary, for example, in the case of a capacitive key which is also path less.

Basically, a sufficiently great difference between the pyrovoltage occurring at normal temperature changes and the useful piezovoltage produced by the intentional pressure is already achieved in the normal case by the dimensions of the body of the transducer according to the invention, in particular by a small thickness or wall thickness, respectively, in regard to the other dimensions, preferably in regard to the height $d$ of the polarized sub-volume. A supporting member which is provided, if required, has an advantageous influence because it effects a certain heat insulation of the piezoelectrically and therewith also pyroelectrically effective body of the transducer. Such heat insulating supporting members are, for example, the small plates 64 and 164, the sealing compound 50 or the supporting member 70.

A further enlargement of the pyrodistance, i.e., of the relation between useful piezovoltage and undesired pyrovoltage, can be achieved by means of two further measures which will be described in detail in the following paragraph.

The total height of the body 1 of the transducer is designed with the dimension H in FIGS. 1 and 2. However, the transducer of this examplary embodiment is polarized only up to the height $h$ and is therewith piezoelectric only up to this height, as was described in the foregoing discussion. A piezoelectrically produced voltage can be collected between the electrodes 24 and 25 when pressure is applied to the body 1. However, in the zone H − $h$ of the body 1, i.e., between the electrodes 124 and 125, no piezoelectric voltage occurs due to the lack of an aligned polarization of the material of the body, not even when pressure is applied. By the same token, however, a pyroelectric voltage does not develop due to this lack of an aligned polarization.

Because the body 1 is divided into a piezoelectrically (and pyroelectrically) effective and a piezoelectrically (and pyroelectrically) ineffective part, a very good heat insulation of the effective partial volume $h \cdot l \cdot d$ can be effected with respect to heat flow from the surface 3. As is illustrated in FIG. 1, the surface 3 is the upper front surface of the nonpolarized part of the body 1.

The aforementioned division actually leads to a loss of mechanical work which is required for the actuation of the key according to the invention. This loss consists in that the nonpiezoelectrically effective sub-volume of the body 1 also experiences a mechanical deformation between the electrodes 124 and 125 which, however, does not supply a piezovoltate. In the normal case, such a loss of work is insufficient since the increase, which is necessarily connected therewith, of the required path of the determined compressive force is of no interest because the total occurring actuating path is already inperspectively small.

The relation of the height $h$ to the total height H is preferably selected between 0.8 and 0.6. The increase in distance of the actuating path which is already inperspectively small in the normal case is about 20% to 40% in the case of this dimension. The above described particular further development of the body 1 is also advantageous for other forms of piezoelectric transducer bodies of the key constructed in accordance with the invention. In particular, in the case of the tube shaped member 31 illustrated in FIG. 3 and in the case of a number 41 having a curved profile, as illustrated in FIG. 4, a division of the body can be provided with respect to the direction of an intentionally applied compressive force.

Another technique for providing thermal insulation of a key according to the invention includes the mounting of the body of the transducer of the key into a heat insulating housing. This measure may be provided in addition to the measures for heat insulation already described.

FIGS. 5, 7, 9 and 10 illustrate mountings having a thermal insulating effect. It is particularly important in the case of heat insulation, and the same applies also to heat insulation by means of the described supporting members, that the body of the transducer be insulated with respect to rapid temperature changes. A low temperature change of the body in a key constructed according to the invention, results in only such pyrovoltages which increase as slowly and therewith considerably slower than the piezoelectric useful voltage. By means of an electrical discharge with a high pass effect, e.g. in the form of an electrical resistance connected in parallel with respect to the piezoceramic, the construction of a free load which causes the pyrovoltage can be suppressed.

FIGS. 11–15 illustrate advantageous configurations of the electrodes applied to the piezoceramic body.

FIG. 11 illustrates a piezoelectric body having a height $h$ in a frontal view and FIG. 12 is a lateral view of the same structure. A continuous electrode 1024 is provided on one side of the body 1. On the opposite side of the body 1, the electrode 25 according to FIG. 1 is separated into two individual electrodes 1025 and 1026. The polarization of the material of the body 1 below the electrodes 1025 and 1026 is indicated by the arrows 1021 and 1022. The polarization among these individual electrodes is directed in opposite directions with respect to each other. Connection lines, electrical leads, are identified with the reference characters 1224 and 1225. Due to the polarization in opposite directions, it is sufficient to contact the electrodes on one side of the body 1 with the indicated connections. The upper and the lower halves of the body 1 are electrically connected in series via the electrode 1024.

FIG. 13 illustrates an embodiment of electrodes corresponding to that illustrated in FIGS. 11 and 12 in which the individual electrodes 1025 and 1026 shown in FIGS. 11 and 12 are arranged next to one another across the dimension $l$ and extending in the direction of the dimension $h$.

Figure 14:
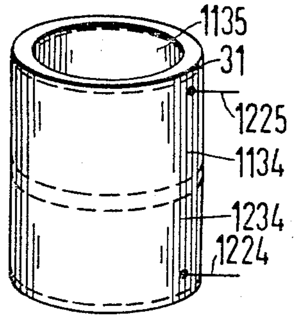

FIG. 14 illustrates an electrode arrangement corresponding to the embodiment and according to FIGS. 11 and 12 for a tube shaped body of the transducer according to FIG. 3. A continuous electrode 1135 is provided on the inner surface of the small tube 31. The electrode 34 according to FIG. 3 is divided on the outer surface of the tube 31 into two individual electrodes 1134 and 1234 which are arranged next to each other in a ring-like manner. In the zone of the ring-shaped electrode 1134, the material of the small tube 31 is oppositely polarized with respect to the zone adjacent the electrode 1234.

Figure 15:
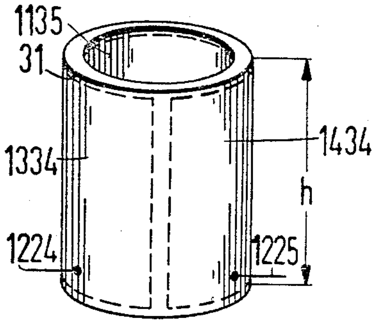

FIG. 15 illustrates an embodiment in which the outer electrode 34 according to FIG. 3 is divided into two peripheral halves as individual electrodes having the designations 1334 and 1434. These two single electrodes are separated from each other on the reverse side of the tube 31 which is not visible in the drawing. The material of the tube 31 in the zone of the first single electrode is oppositely polarized with respect to the material in the zone of the other single electrode.

Also, in the case of the embodiments according to FIGS. 13–15, it is sufficient to contact electrodes on only one side of the body 1 or 31, respectively, of the transducer. The respective counter electrodes 1024, 1035 continue over the individual electrode of the opposite side. The zones adjacent the individual electrodes are therefore connected in series by way of the counter electrode.

Figure 16:
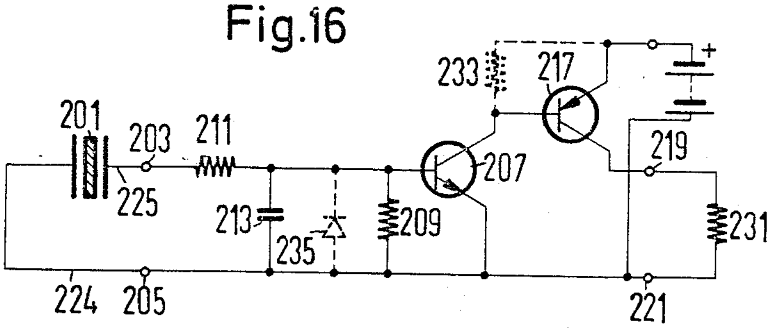
FIGS. 16 and 17 illustrate preferred electronic circuits for the operation of a key according to the invention.
Figure 17:
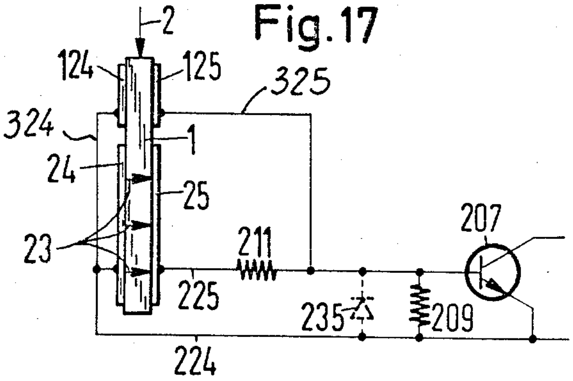

A particularly preferred electronic circuit for the operation of a key according to the invention is illustrated in FIGS. 16 and 17 and will be discussed in detail below.

Referring to FIGS. 16 and 17, the piezoelectric body of a transducer is designated 201 in FIG. 16. Upon the application of an intentional force upon the transducer 201, a piezoelectric voltage is produced at the connection points 203 and 205 or a piezoelectric current, respectively, can be collected at these points by way of the electrical leads 224 and 225. A bipolar input transistor 207 is provided for responding to the output of the transducer. In the case of an npn transistor, the material of the transducer body 201 is polarized in such a way that the terminal 203 is provided with a positive potential with respect to the terminal 205 upon the application of an intentional force. An electrical resistor 209 is connected between the base and the emitter of the transistor 207. The resistor 209 provides a shunt discharge path for charges at the electrodes 24, 25 of the body of the transducer which develop during long periods. Such long term charges appear, in particular, by means of temperature changes of the material of the body of the transducer as a result to the aforementioned pyroeffect. The resistor 209 has a resistance value in the order of $10^7$ ohms. The resistor 209 and the capacitance of the piezoelectric portion of the body 201 advantageously form a high pass filter, the resistance and capacitance values of which are dimensioned at a cut off frequency of $\leq$ 10 Hz. For a key constructed in accordance with the invention, the correct values for obtaining this high pass filter are easily obtainable.

An RC circuit is advantageously provided by a resistor 211 and a capacitor 213. This RC circuit has the purpose of rendering the key particularly insensitive to vibrations. Very high frequency, piezoelectrically occurring voltage pulses might appear due to very great vibrations of the body of the transducer. These pulses have a considerably higher frequency than the piezoelectric useful voltage pulses caused by an intentional compressive force. Resistance and capacitance values of the RC circuit 211, 213 are selected in such a way that the useful voltage pulses are not, or only insufficiently passed and the interference pulses are practically short circuited. Values of about 10 Hz can be taken as a basis as frequency values for the useful voltage pulses and values of 1 KHz are more for the interference pulses.

It is advisable to connect a further transistor stage to the transistor 207. With such a stage a switching current controlled by the key may be obtained in the order of magnitude of $10^{-2}$ ampere, at the output connections 219 and 221. This magnitude of current is sufficient for actuating relays or the like which are symbolically illustrated by the resistor 231.

With the two stage circuit illustrated in FIG. 16, the very high ohmic resistor 209 can be replaced by a resistor 233, showing broken lines connected between the base and the emitter of the transistor 213, which resistor has a resistance value which is smaller by several orders of magnitude. The reduction factor is equal to the factor of the current amplification of the transistor 207. A diode 235 is connected between the base and the emitter of the input transistor 207 so that, in the case of such a circuit with a resistor 233 instead of the resistor 209, no pyrocharging voltage of opposite polarity can be effective from the terminals 203 and 205.

As has been already indicated above, the part $H - h$ of the body 1 of the transducer, i.e. the nonpiezoelectrically effective part in the zone between the electrodes 124 and 125, can very advantageously be utilized for the capacitor 213. FIG. 16 illustrates a corresponding embodiment for the circuit according to FIG. 11. Details already mentioned above have corresponding reference characters in FIG. 17. The electrical connections for the electrodes 124 and 125 have been provided with the designations 324 and 325.

The resistance associated with the RC circuit consisting of the resistor 211 and the capacitor 213 can be applied on one surface of the body of the transducer, in particular in the case of a flat embodiment of a transducer, as illustrated in the drawings. This resistance may even be a portion of one of the electrodes on the body, in particular a part of the electrode 24 or 25.

In accordance with the features of a key constructed according to the invention, in particular in accordance with the selection of aligning the polarization perpendicular to the direction of an intentional compressive force, the so-called piezoelectric transverse effect is exploited. An advantageous impedance adaption of the piezoelectric body of the transducer of the key to the given input impedance of the electronic transistor circuit of the key can therefore be achieved.

The electronic circuit of the key is preferably also mounted into the housing of the key, i.e., within the housing 90.

A particularly preferred method for the production of a key provided with supporting members will also be described hereinbelow. This method relates, in particular, to a key with a flat body 1 for the transducer, and deals with the mechanical connection between the body 1 of the transducer and one or several supporting members, e.g., the supporting members 64 and 164 in FIG. 6. This particularly preferred method comprises the step, while using particularly duroplastic materials (thermosetting plastic materials) of connecting one or several supporting members mechanically rigid with the body 1 of the transducer. The duroplastic material may be a coating consisting of such a material provided on the corresponding side of the supporting member, or a layer consisting of duroplastic material may be inserted. The one or several supporting members of the body of the transducer are pressed together by means of application of pressure and heat so that the duroplastic material is able to create a durable mechanical connection. If necessary, corresponding bores, windows, apertures, recesses or the like may be provided in the supporting members for electro connections to the electrodes 24, 25 or 124, 125, respectively. Electrical connection means may be provided in the recesses which create the contact to the connection contact provided at the body. The electrical connection between the connection contacts and the contacts in the recesses can advantageously be realized by known thin layer conductor paths.

Figure 18:
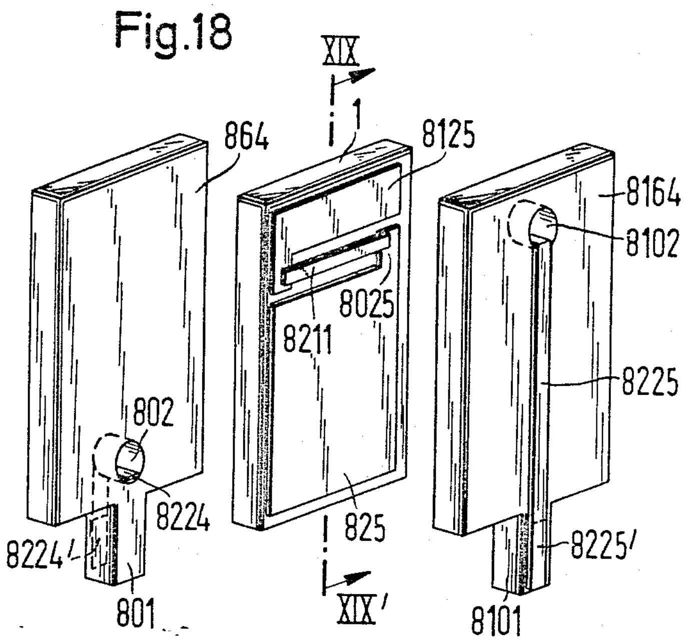
FIGS. 18 and 19 illustrate a particularly preferred embodiment of a key according to the invention, shown in an exploded fashion, FIG. 19 illustrating the apparatus in section.
Figure 19:
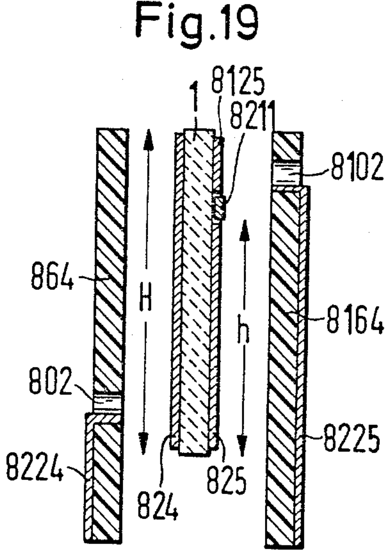

Referring to FIGS. 18 and 19, a particularly preferred embodiment of a key according to the invention is illustrated as comprising a resistor 211 and a capacitor 213, constructed in accordance with the above method and referenced with different characters to better illustrate the structural formation thereof. In FIGS. 18 and 19 essential parts of the key shown which were illustrated in FIG. 6, but which here have been given some additional identifying reference characters, namely the piezoelectric body 1 of the transducer has the small supporting plates referenced 864 and 8164. These supporting members correspond to the supporting members 64 and 164 but have been provided with projecting feet 801 and 8101 and bores 802 and 8102 as recesses for providing contacts. The illustration in FIG. 18 can also be referred to as an exploded illustration in that these elements, in practice, are contacting in a layer type arrangement. FIG. 19 is, of course, a cross section of the exploded apparatus in FIG. 18, taken generally along the line XIX—XIX.

The electrodes of the body 1 are identified as 824 and 825. The electrode of the capacitor 213 carries the designation 8125 and can be compared with the electrode 125 of FIG. 1. The counter electrode to the electrode 8125 is the upper part of the electrode 824. The electrodes 825 and 8125 have extending feet arranged on the corresponding feet 801 and 8101 of the supporting members 864 and 8164. Between these extending conductors, here referenced 8224' and 8225' is arranged a resistor 8211, e.g., a resistance layer, which is applied to the body 1. This resistor has an electrical contact with the electrode 8125 at its one end and with the extending projection 8025 of the electrode 825 at its other end. The resistor 8211 is a realization of the aforementioned resistor 211, and its resistance value is dimensioned corresponding to the resistor 211 by the selection of width and thickness as well as by the applied resistance material of the element 8211.

Electrical connections of the electrodes 824 and 8125 are realized by means of the thin layer electrical connections 8224 and 8225, each of which extends through a respective bore 802 and 8102. Instead of connections extending through the bores, the bores may also be filled in a contacting manner with an electrically conductive material. The aforementioned feet 801 and 8101 may serve, for example, for inserting the piezoelectric transducer, which is mounted in a housing (not illustrated) together with the supporting members 864 and 8164 into a support structure which is provided for the piezoelectric key, e.g., FIG. 9. During the process of inserting the transducer into a support structure, the electrical connections are effected at the connection contacts 8224' and 8225' of the key, which electrical connections are identified as 224 and 225 in the circuit according to FIG. 16.

It may be pointed out that the dimensions in FIGS. 18 and 19 in particular the thickness dimensions of the body as well as of the electrical coatings are illustrated in an exaggerated form so that they appear considerably thicker in comparison to practical cases of application. This distortion of scale is provided to guarantee a clearer identification of the elements; actual dimensions for embodiments, which also pertain to FIGS. 18 and 19, have already been given here before.

Although I have described my invention by reference to a particular embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A key for controlling an amplifier of an electronic circuit in response to the application thereto of an intentionally applied and dimensioned compressive force, comprising:

a piezoelectric transducer including a body of piezoceramic material for receiving the compressive force, a pair of electrodes on said body for taking off electrical signals and for connection to the amplifier, said body having a substantially constant cross section perpendicular to the compressive force, said body polarized in a direction $d$ in at least a subvolume ($d$ . $l$ . $h$) thereof where $d$ is the thickness dimension, $l$ is the length dimension, and $h$ is the height dimension, said electrodes mounted on opposite surfaces of said body spaced apart the thickness $d$, the thickness $d$ perpendicular to the direction of the compressive force, the length $l$ being perpendicular to the thickness $d$ and to the direction of the compressive force and is greater than the thickness $d$, and the height $h$ is perpendicular to the thickness $d$ and the length $l$ and is greater than 10$d$.

2. The key of claim 1, wherein said body includes a base surface having an area $l$ . $d$ of less than 5 mm$^2$.

3. The key of claim 2, wherein said base surface has an area of 1 mm$^2$.

4. The key of claim 1, wherein the length $l$ is at least 20$d$.

5. The key of claim 1, wherein the length $l$ is 50$d$.

6. The key of claim 1, wherein the length $l$ is in a range of from 5 to 20 mm.

7. The key of claim 1, wherein the length $l$ is dimensioned according to the equation $$l = n . |g_{31}| . K/U$$

where K is the compressive force acting upon the surface $l$ . $d$ of said body, $g_{31}$ is the piezoelectric voltage constant of the material of said body, U is the response voltage necessary for actuating the electronic circuit and n is a value in a range of from 0.3 to 2.0.

8. The key of claim 1, wherein the thickness $d$ is less than 0.5 mm.

9. The key of claim 1, wherein the thickness $d$ is in a range of from 0.05 to 0.15 mm.

10. The key of claim 1, wherein said body includes surface areas defined by the dimensions $l$ . $h$ and said electrodes cover respective ones of such surface areas.

11. A key for controlling an amplifier of an electronic circuit in response to the application thereto of an intentionally applied and dimensioned compressive force, comprising:

a piezoelectric transducer including a body of piezoceramic material for receiving the compressive force, a pair of electrodes on said body for taking off electrical signals and for connection to the amplifier, said body having a substantially constant cross section perpendicular to the compressive force, said body polarized in a direction $d$ is at least a subvolume ($d$ . $l$ . $h$) thereof where $d$ is the thickness dimension, l is the length dimension, and $h$ is the height dimension, said electrodes mounted on opposite surfaces of said body spaced apart the thickness $d$, the thickness $d$ perpendicular to the direction of the compressive force, the length $l$ being perpendicular to the thickness $d$ and to the direction of the compressive force and is greater than the thickness $d$, the height $h$ is perpendicular to the thickness $d$ and the length $l$ and is greater than 10$d$, and support means mounted against said body and cooperable therewith to resist bending in response to the application of the intentionally applied compressive force.

12. The key of claim 11, wherein said support means, in the direction of the force, has an integral pressure elastic resilience which is substantially the same as to greater than that of said body.

13. The key of claim 11, wherein said support means comprises a pair of plates fixed to opposite surfaces of said body.

14. The key of claim 11, wherein said support means comprises a member embedding said body and having an X-shaped profile in the direction parallel to the direction of force application.

15. The key of claim 13, wherein each of said plates has dimensions corresponding to the corresponding dimensions of the respective surface on which it is fixed.

16. The key of claim 15, wherein each of said plates has a thickness which provides the bending resistance and an integral pressure elastic resilience greater than that of said body in the direction of the applied force.

17. The key of claim 13, wherein said plates are mounted on the two largest lateral surfaces of said body.

18. The key of claim 13, wherein said plates are bonded to said body.

19. The key of claim 13, wherein said plates consist of synthetic material.

20. The key of claim 11, wherein said housing includes a force transmission member, mounting said body only in a small zone of said body.

21. The key of claim 20, wherein said housing includes external surfaces, a force receiving member, and mounting flanges extending from said surfaces adjacent said member.

22. The key of claim 11, comprising supporting means including a pair of support plates, and thermoplastic bonding means securing said plates to opposite surfaces of said body.

23. The key of claim 22, wherein said plates include recesses for receiving respective electrical connections for said electrodes.

24. The key of claim 23, comprising conductive strips carried in said recesses and connected to the electrodes.

25. A key for controlling an amplifier of an electronic circuit in response to the application thereto of an intentionally applied and dimensioned compressive force, comprising:

a piezoelectric transducer including a body of piezoceramic material for receiving the compressive force, a pair of electrodes on said body for taking off electrical signals and for connection to the amplifier, said body having a substantially constant cross section perpendicular to the compressive force, said body polarized in a direction $d$ in at least a subvolume $(d.l.h)$ thereof where $d$ is the thickness dimension, $l$ is the length dimension, and $h$ is the height dimension, said electrodes mounted on opposite surfaces of said body spaced apart the thickness $d$, the thickness $d$ perpendicular to the direction of the compressive force, the length $l$ being perpendicular to the thickness $d$ and to the direction of the compressive force and is greater than the thickness $d$, the height $h$ is perpendicular to the thickness $d$ and the length $l$ and is greater than $10d$, and heat insulating means surrounding said body.

26. The key of claim 25, wherein said heat insulating means comprises a material which is less compression resistant than said body.

27. A key for controlling an amplifier of an electronic circuit in response to the application thereto of an intentionally applied and dimensioned compressive force, comprising:

a piezoelectric transducer including a body of piezoceramic material for receiving the compressive force, a pair of electrodes on said body for taking off electrical signals and for connection to the amplifier, said body having a substantially constant cross section perpendicular to the compressive force, said body polarized in a direction $d$ in at least a subvolume $(d . l . h)$ thereof where $d$ is the thickness dimension, $l$ is the length dimension, and $h$ is the height dimension, said electrodes mounted on opposite surfaces of said body spaced apart the thickness $d$, the thickness $d$ perpendicular to the direction of the compressive force, the length $l$ being perpendicular to the thickness $d$ and to the direction of the compressive force and is greater than the thickness $d$, the height $h$ is perpendicular to the thickness $d$ and the length $l$ and is greater than $10d$, and a housing for said transducer, said housing including a base, a cover to receive the force, a body mounted between said base and said cover, and walls adjoining said base and said cover and having less compression resistance to the force than to said body.

28. The key of claim 27, wherein said housing includes a base having a groove therein and a cover having grooved means, said body mounted in said groove and said grooved means.

29. A key for controlling an amplifier of an electronic circuit in response to the application thereto of an intentionally applied and dimensioned compressive force, comprising:

a piezoelectric transducer including a body of piezoceramic material for receiving the compressive force, a pair of electrodes on said body for taking off electrical signals and for connection to the amplifier, said body having a substantially constant cross section perpendicular to the compressive force, said body polarized in a direction $d$ in at least a subvolume $(d . l . h)$ thereof where $d$ is the thickness dimension, $l$ is the length dimension, and $h$ is the height dimension, said electrodes mounted on opposite surfaces of said body spaced apart the thickness $d$, the thickness $d$ perpendicular to the direction of the compressive force, the length $l$ being perpendicular to the thickness $d$ and the length $l$ and is greater than $10d$, and a housing for said transducer including a base and a cover plate mounting said body therebetween, and a plurality of side walls joining said base and said cover, said side walls being resilient with respect to the compressive force and said base being slightly resistant to bending.

30. A key for controlling an amplifier of an electronic circuit in response to the application thereto of an intentionally applied and dimensioned compressive force, comprising:

a piezoelectric transducer including a body of piezoceramic material for receiving the compressive force, a pair of electrodes on said body for taking off electrical signals and for connection to the amplifier,
said body having a substantially constant cross section perpendicular to the compressive force,
said body polarized in a direction *d* in at least a sub-volume (*d* . *l* . *h*) thereof where *d* is the thickness dimension, *l* is the length dimension, and *h* is the height dimension,
said electrodes mounted on opposite surfaces of said body spaced apart the thickness *d*,
the thickness *d* perpendicular to the direction of the compressive force, the length *l* being perpendicular to the thickness *d* and to the direction of the compressive force and is greater than the thickness *d*,
the height *h* is perpendicular to the thickness *d* and the length *l* and is greater than 10*d*, and
a second electrode mounted adjacent and electrically insulated from and having the same surface as one of the first-mentioned electrodes, said body being polarized in opposite directions in the zones adjacent said adjacent electrodes.

31. A key for controlling an amplifier of an electronic circuit in response to the application thereto of an intentionally applied and dimensioned compressive force, comprising:
a piezoelectric transducer including a body of piezoceramic material for receiving the compressive force,
a pair of electrodes on said body for taking off electrical signals and for connection to the amplifier,
said body having a substantially constant cross section perpendicular to the compressive force,
said body polarized in a direction *d* in at least a sub-volume (*d* . *l* . *h*) thereof where *d* is the thickness dimension, *l* is the length dimension, and *h* is the height dimension,
said electrodes mounted on opposite surfaces of said body spaced apart the thickness *d*,
the thickness *d* perpendicular to the direction of the compressive force, the length *l* being perpendicular to the thickness *d* and to the direction of the compressive force and is greater than the thickness *d*,
the height *h* is perpendicular to the thickness *d* and the length *l* and is greater than 10*d*, and
a housing mounting said body including means receiving a compressive force in one direction and converting the force and applying it to said body in a direction perpendicular to said one direction.

32. A key for controlling an amplifier of an electronic circuit in response to the application thereto of an intentionally applied and dimensioned compressive force, comprising:
a piezoelectric transducer including a body of piezoceramic material for receiving the compressive force,
a pair of electrodes on said body for taking off electrical signals and for connection to the amplifier,
said body having a substantially constant cross section perpendicular to the compressive force,
said body polarized in a direction *d* in at least a sub-volume (*d* . *l* . *h*) thereof where *d* is the thickness dimension, *l* is the length dimension, and *h* is the height dimension,
said electrodes mounted on opposite surfaces of said body spaced apart the thickness *d*,
the thickness *d* perpendicular to the direction of the compressive force, the length *l* being perpendicular to the thickness *d* and to the direction of the compressive force and is greater than the thickness *d*,
the height *h* is perpendicular to the thickness *d* and the length *l* and is greater than 10*d*, and
a second pair of electrodes mounted adjacent respective ones of the first-mentioned electrodes to form a capacitor for connection in circuit with the amplifier.

33. A key for controlling an amplifier of an electronic circuit in response to the application thereto of an intentionally applied and dimensioned compressive force, comprising:
a piezoelectric transducer including a body of piezoceramic material for receiving the compressive force,
a pair of electrodes on said body for taking off electrical signals and for connection to the amplifier,
said body having a substantially constant cross section perpendicular to the compressive force,
said body polarized in a direction *d* in at least a sub-volume (*d* . *l* . *h*) thereof where *d* is the thickness dimension, *l* is the length dimension, and *h* is the height dimension,
said electrodes mounted on opposite surfaces of said body spaced apart the thickness *d*,
the thickness *d* perpendicular to the direction of the compressive force, the length *l* being perpendicular to the thickness *d* and to the direction of the compressive force and is greater than the thickness *d*,
the height *h* is perpendicular to the thickness *d* and the length *l* and is greater than 10*d*, and
said body having a total height H and including a piezoelectric portion *h* and a non-piezoelectric portion H – *h*.

34. The key of claim 33, wherein said piezoelectric portion and said nonpiezoelectric portion are a single piece, said piezoelectric portion being the polarized sub-volume.

35. The key of claim 34, comprising an actuating member and wherein said nonpiezoelectric portion H–*h* is mounted facing said actuating member.

36. An electronic key circuit operable in response to the application thereto of an intentionally applied and dimensioned compressive force, comprising:
an amplifier,
a piezoelectric transducer including a body of piezoceramic material for receiving the compressive force,
a pair of electrodes on said body for taking off electrical signals and connected to the input of the amplifier,
said body having a substantially constant cross section perpendicular to the compressive force,
said body polarized in a direction *d* in at least a sub-volume (*d* . *l* . *h*) thereof where *d* is the thickness dimension, *l* is the length dimension, and *h* is the height dimension,
said electrodes mounted on opposite surfaces of said body spaced apart the thickness *d*,
the thickness *d* perpendicular to the direction of the compressive force, the length *l* being perpendicular to the thickness *d* and to the direction of the compressive force and is greater than the thickness *d*,
the height *h* is perpendicular to the thickness *d* and the length *l* and is greater than 10*d*, and an RC filter, said body having a total height H, a second pair of electrodes mounted on opposite surfaces of said body in the zone H–*h* to form a capacitance of said RC filter.

37. The electronic key circuit of claim 36, wherein said RC filter is a low pass RC filter which comprises a resistor, said resistor defined by a strip of resistance material connecting a first-mentioned electrode and a second electrode which are mounted on the same surface of said body.

38. The electronic key circuit of claim 36, comprising a low pass RC filter connecting said body and said amplifier and operable to short circuit frequencies higher than 100 Hz.

39. The electronic key circuit of claim 38, wherein one of the first-mentioned electrodes and the second electrode which is mounted therewith on the same body surface are electrically connected.

40. The electronic key circuit of claim 38, comprising a high pass RC filter connected to said body to prevent frequencies of higher than 10 Hz from being discharged.

41. The electronic key circuit of claim 40, wherein said electrodes constitute the capacitor plates of the capacitance of high pass RC filter and said high pass RC filter includes a resistor connected across the input of said amplifier.

* * * * *